United States Patent
Long et al.

(10) Patent No.: US 10,725,356 B2
(45) Date of Patent: Jul. 28, 2020

(54) ARRAY SUBSTRATE, DISPLAY PANEL AND DISPLAY APPARATUS

(71) Applicant: BOE Technology Group Co., Ltd., Beijing (CN)

(72) Inventors: Chunping Long, Beijing (CN); Jian Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/477,915

(22) PCT Filed: Jul. 25, 2018

(86) PCT No.: PCT/CN2018/096960
§ 371 (c)(1),
(2) Date: Jul. 15, 2019

(87) PCT Pub. No.: WO2019/047627
PCT Pub. Date: Mar. 14, 2019

(65) Prior Publication Data
US 2019/0369452 A1 Dec. 5, 2019

(30) Foreign Application Priority Data
Sep. 5, 2017 (CN) .......................... 2017 1 0790705

(51) Int. Cl.
*H01L 27/12* (2006.01)
*G02F 1/1362* (2006.01)
*G02F 1/1368* (2006.01)

(52) U.S. Cl.
CPC ...... *G02F 1/136286* (2013.01); *G02F 1/1368* (2013.01); *G02F 1/13624* (2013.01);
(Continued)

(58) Field of Classification Search
CPC . H01L 27/124; G02F 1/1368; G02F 1/13624; G02F 1/136286; G02F 2201/121; G02F 2201/123
See application file for complete search history.

(56) References Cited

U.S. PATENT DOCUMENTS

2004/0164943 A1 8/2004 Ogawa et al.
2008/0284967 A1* 11/2008 Oh .................... G02F 1/134363
349/144

(Continued)

FOREIGN PATENT DOCUMENTS

| CN | 1506719 A | 6/2004 |
|---|---|---|
| CN | 103135849 A | 6/2013 |

(Continued)

OTHER PUBLICATIONS

Chinese Office Action dated Aug. 29, 2019 for corresponding application CN 201710790705.1.

*Primary Examiner* — Ahmed N Sefer
(74) *Attorney, Agent, or Firm* — Arent Fox LLP; Michael Fainberg

(57) ABSTRACT

An array substrate, a display panel and a display apparatus, used to improve crosstalk and afterimage, and increase display quality. The array substrate comprises a base substrate, several gate lines located on the base substrate, and several first common electrode lines, several second common electrode lines and several third common electrode lines located on the base substrate. The first common electrode lines are arranged in a parallel manner with respect to the gate lines, each first common electrode line being located in an area between two adjacent gate lines. The second common electrode lines are arranged in an insulated and intersecting manner with respect to the first common electrode lines, and the second common electrode lines are electrically connected to one portion of the first common (Continued)

electrode lines. The third common electrode lines are arranged in an insulated and intersecting manner with respect to the first common electrode lines.

18 Claims, 10 Drawing Sheets

(52) U.S. Cl.
CPC ...... *H01L 27/124* (2013.01); *G02F 2201/121* (2013.01); *G02F 2201/123* (2013.01)

(56) References Cited

U.S. PATENT DOCUMENTS

| | | | |
|---|---|---|---|
| 2009/0040166 A1* | 2/2009 | Lee ................... | G02F 1/1345 345/98 |
| 2009/0058785 A1* | 3/2009 | Kim ................... | G09G 3/3611 345/96 |
| 2009/0206339 A1* | 8/2009 | Park ................... | B82Y 20/00 257/59 |
| 2010/0194695 A1 | 8/2010 | Hotelling et al. | |
| 2010/0225859 A1* | 9/2010 | Tsai ................... | G02F 1/136213 349/106 |
| 2013/0016293 A1* | 1/2013 | Cho ................... | G02B 5/201 349/15 |
| 2013/0033439 A1* | 2/2013 | Kim ................... | G02F 1/13338 345/173 |
| 2013/0057814 A1* | 3/2013 | Prushinskiy ...... | G02F 1/133784 349/123 |
| 2014/0016074 A1 | 1/2014 | Yonekura et al. | |
| 2014/0118651 A1 | 5/2014 | Hirosawa | |
| 2014/0347586 A1* | 11/2014 | Wang ................... | G02F 1/13394 349/43 |
| 2016/0320675 A1* | 11/2016 | Lee ................... | G02F 1/134309 |
| 2016/0370666 A1* | 12/2016 | Gao ................... | G02F 1/136259 |
| 2019/0051667 A1* | 2/2019 | Cai ................... | G02F 1/1345 |
| 2019/0369452 A1 | 12/2019 | Long et al. | |

FOREIGN PATENT DOCUMENTS

| | | |
|---|---|---|
| CN | 103543563 A | 1/2014 |
| CN | 104142593 A | 11/2014 |
| CN | 105867033 A | 8/2016 |
| CN | 106249498 A | 12/2016 |
| CN | 107357105 A | 11/2017 |

* cited by examiner

ARRAY SUBSTRATE, DISPLAY PANEL AND DISPLAY APPARATUS

CROSS REFERENCE

This application is a US National Stage of International Application No. PCT/CN2018/096960, filed on Jul. 25, 2018, designating the United States and claiming the priority of Chinese Patent Application No. 201710790705.1, filed with the Chinese Patent Office on Sep. 5, 2017, and entitled "an array substrate, a display panel, and a display device". The entire disclosure of each of the applications above is incorporated herein by reference.

FIELD

The present disclosure relates to the field of display technologies, and particularly to an array substrate, a display panel, and a display device.

BACKGROUND

Liquid-crystal display technology is widely used on products such as TV sets, mobile phones, and public information displays, and is the most widely applied display technology among present technologies. Image quality of a liquid-crystal display is an important factor for success of the abovementioned products. Liquid-crystal displays are commonly used flat panel displays, and a thin-film-transistor liquid-crystal display (TFT-LCD) is a predominant product among liquid-crystal displays. A liquid-crystal display panel has the advantages of a small size, low power consumption, no radiation, high resolution, and etc.

An array substrate is an important component of a liquid crystal display device, and common electrode lines are typically arranged in the array substrate in related art, where the common electrode lines can provide common voltage required for the liquid crystal display device. However, a crosstalk and an afterimage tend to occur in a display panel due to the design of the common electrode lines, thus degrading the display quality of the display panel.

SUMMARY

Embodiments of this disclosure provide an array substrate, a display panel, and a display device.

An embodiment of this disclosure provides an array substrate. The array substrate includes a base substrate, a plurality of first gate lines located on the base substrate, and a plurality of first common electrode lines, a plurality of second common electrode lines, and a plurality of third common electrode lines, each located on the base substrate. The plurality of first common electrode lines are arranged parallel to the plurality of first gate lines, and each of the plurality of first common electrode lines is located between two adjacent first gate lines of the plurality of first gate lines. The plurality of second common electrode lines intersect with and are insulated from the plurality of first common electrode lines, and are electrically connected with a part of the plurality of first common electrode lines. The plurality of third common electrode lines intersect with and are insulated from the plurality of first common electrode lines, and are electrically connected with another part of the plurality of first common electrode lines. Voltage values of voltage signals received by the plurality of second common electrode lines and by the plurality of third common electrode lines are different.

According to an implementation mode of the embodiment of the disclosure, the array substrate further includes a plurality of data lines. The plurality of second common electrode lines are arranged parallel to the plurality of data lines, and the plurality of third common electrode lines are arranged parallel to the plurality of data lines.

According to an implementation mode of the embodiment of the disclosure, the array substrate further includes a plurality of sub-pixel elements arranged in an array, each including a thin film transistor, and a plurality of common electrode connection lines. The plurality of second common electrode lines each include a plurality of second sub-common electrode lines, an area between adjacent two of the plurality of second sub-common electrode lines corresponds to an area of one of the thin film transistors, and the adjacent two second sub-common electrode lines are bridged through one of the plurality of common electrode connection lines. Or, the plurality of third common electrode lines each include a plurality of third sub-common electrode lines, an area between adjacent two of the plurality of third sub-common electrode lines corresponds to an area of one of the thin film transistors, and the adjacent two third sub-common electrode lines are bridged through one of the plurality of common electrode connection lines.

According to an implementation mode of the embodiment of the disclosure, the array substrate further includes a plurality of sub-pixel elements arranged in an array, each including a thin film transistor, and a plurality of first common electrode connection lines and second common electrode connection lines. The plurality of second common electrode lines each include a plurality of second sub-common electrode lines, an area between adjacent two of the plurality of second sub-common electrode lines corresponds to an area of one of the thin film transistors, and the adjacent two second sub-common electrode lines are bridged through one of the plurality of first common electrode connection lines. The plurality of third common electrode lines each include a plurality of third sub-common electrode lines, an area between adjacent two of the plurality of third sub-common electrode lines corresponds to an area of one of the thin film transistors, and the adjacent two third sub-common electrode lines are bridged through one of the plurality of second common electrode connection lines.

According to an implementation mode of the embodiment of the disclosure, each of the plurality of second common electrode lines is arranged in a broken line, and each of the plurality of third common electrode lines is arranged in a broken line.

According to an implementation mode of the embodiment of the disclosure, the array substrate further includes a plurality of data lines, and a plurality of sub-pixel elements arranged in an array. Each of the plurality of sub-pixel elements includes a thin film transistor. A part of each of the plurality of second common electrode lines is arranged parallel to the plurality of data lines, and another part thereof is arranged parallel to the plurality of first gate lines, so that the plurality of second common electrode lines bypass the thin film transistors. A part of each of the plurality of third common electrode lines is arranged parallel to the plurality of data lines, and another part thereof is arranged parallel to the plurality of first gate lines, so that the plurality of third common electrode lines bypass the thin film transistors.

According to an implementation mode of the embodiment of the disclosure, the array substrate further includes a plurality of sub-pixel elements arranged in an array. The plurality of second common electrode lines and/or the plurality of third common electrode lines are arranged in areas corresponding to at least a part of the plurality of sub-pixel elements.

According to an implementation mode of the embodiment of the disclosure, the array substrate further includes a plurality of second gate lines. The plurality of second gate lines and the plurality of first gate lines are located on different sides of rows of the plurality of sub-pixel elements. Adjacent two of the plurality of sub-pixel elements in each row connected by a same data line are connected with one of the plurality of second gate lines and one of the plurality of first gate lines arranged on two sides of the adjacent two sub-pixel elements, respectively.

According to an implementation mode of the embodiment of the disclosure, the array substrate further includes a first insulation layer located between the plurality of second common electrode lines and the plurality of first common electrode lines, and a second insulation layer located between the plurality of third common electrode lines and the plurality of first common electrode lines. The plurality of second common electrode lines are electrically connected with the plurality of first common electrode lines through first through-holes running through the first insulation layer, and the plurality of third common electrode lines are electrically connected with the plurality of first common electrode lines through second through-holes running through the second insulation layer. Areas including first sub-pixel elements correspond to the first through-holes, and areas including second sub-pixel elements correspond to the second through-holes. The first sub-pixel elements and the second sub-pixel elements are sub-pixel elements at different positions.

According to an implementation mode of the embodiment of the disclosure, the array substrate further includes a first insulation layer located between the plurality of second common electrode lines and the plurality of first common electrode lines, and a second insulation layer located between the plurality of third common electrode lines and the plurality of first common electrode lines. The plurality of second common electrode lines are electrically connected with the plurality of first common electrode lines through first through-holes running through the first insulation layer, and the plurality of third common electrode lines are electrically connected with the plurality of first common electrode lines through second through-holes running through the second insulation layer. The first through-holes and the second through-holes are arranged alternately in a row direction. In a column direction: two of the second through-holes are arranged in different adjacent columns of adjacent two of the first through-holes, respectively, and two of the first through-holes are arranged in different adjacent columns of adjacent two of the second through-holes, respectively.

According to an implementation mode of the embodiment of the disclosure, the array substrate further includes a first insulation layer located between the plurality of second common electrode lines and the plurality of first common electrode lines, and a second insulation layer located between the plurality of third common electrode lines and the plurality of first common electrode lines. The plurality of second common electrode lines are electrically connected with the plurality of first common electrode lines through first through-holes running through the first insulation layer, and the plurality of third common electrode lines are electrically connected with the plurality of first common electrode lines through second through-holes running through the second insulation layer. The first through-holes and the second through-holes are located in different rows.

According to an implementation mode of the embodiment of the disclosure, each of the plurality of sub-pixel elements includes a pixel electrode. Orthographic projections on the base substrate of the plurality of second common electrode lines overlap orthographic projections on the base substrate of pixel electrodes included by at least a part of the plurality of sub-pixel elements, where the at least a part of the plurality of sub-pixel elements correspond to the areas where the plurality of second common electrode lines are arranged. And/or, orthographic projections on the base substrate of the plurality of third common electrode lines overlap orthographic projections on the base substrate of pixel electrodes included by at least a part of the plurality of sub-pixel elements, where the at least a part of the plurality of sub-pixel elements correspond to the areas where the plurality of third common electrode lines are arranged.

According to an implementation mode of the embodiment of the disclosure, the array substrate further includes a plurality of data lines. The plurality of first common electrode lines and the plurality of first gate lines are arranged in a same layer. The plurality of second common electrode lines and the plurality of third common electrode lines are arranged at a same layer and are insulated from each other. The plurality of second common electrode lines and the plurality of third common electrode lines are arranged at the same layer as the plurality of data lines.

An embodiment of this disclosure further provides a display panel including the array substrate above.

An embodiment of this disclosure further provides a display device including the display panel above.

DETAILED DESCRIPTION OF THE EMBODIMENTS

Figure 1:
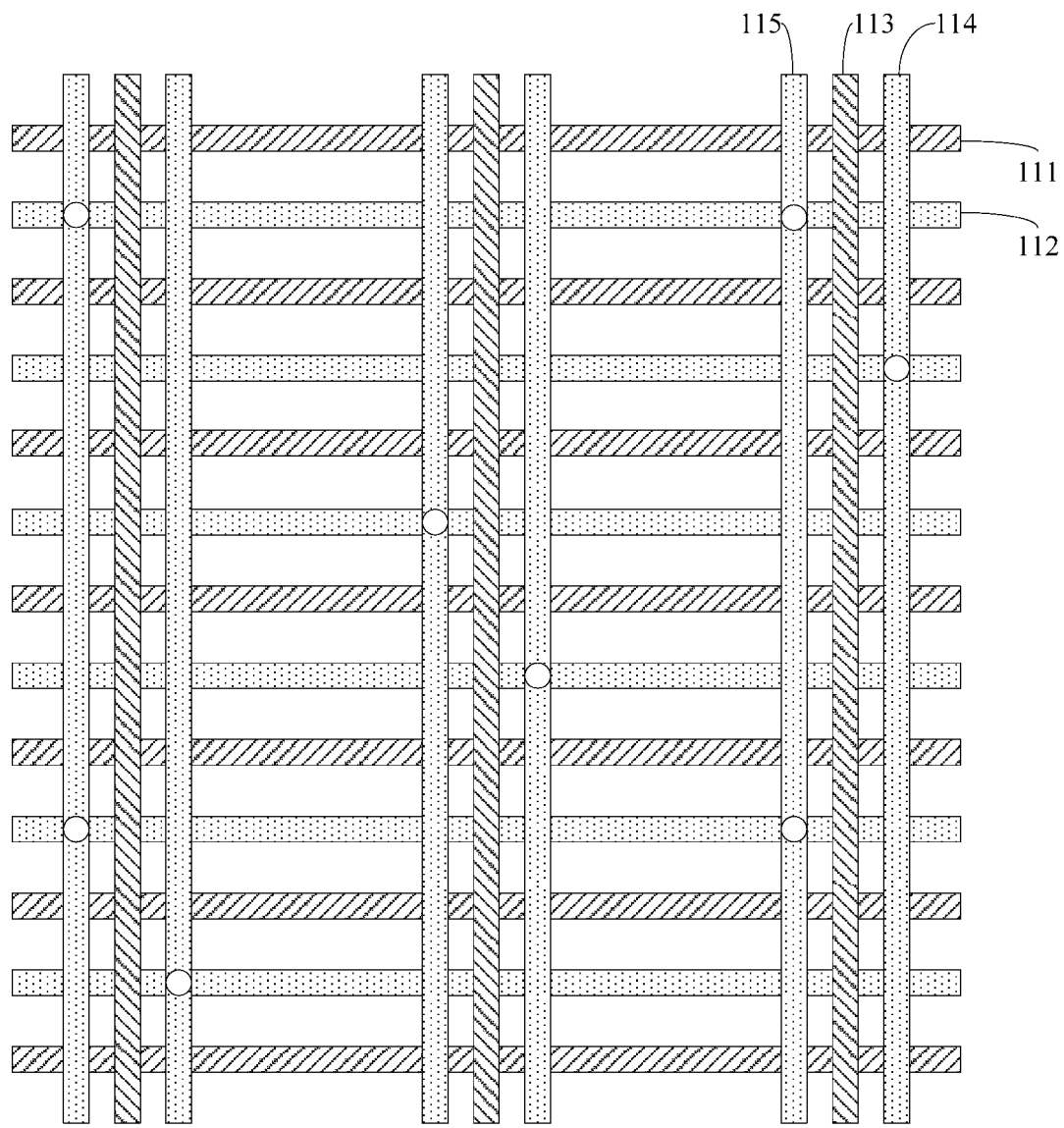
FIG. 1 is a schematic diagram of a structure of an array substrate according to an embodiment of this disclosure.

The embodiments of this disclosure provide an array substrate, a display panel, and a display device to alleviate the problem of crosstalk and afterimage, and to improve the display quality.

In order to make the objects, technical solutions, and advantages of this disclosure more apparent, this disclosure will be described below in further detail with reference to the drawings. Apparently the embodiments to be described are only a part but not all of the embodiments of this disclosure. Based upon the embodiments herein of this disclosure, all other embodiments which can occur to those ordinarily skilled in the art without any inventive effort shall come into the scope of this disclosure as claimed.

An array substrate according to an embodiment of this disclosure will be described below in details with reference to the drawings.

Shapes and sizes of respective layers in the drawings are not intended to reflect their real proportions, but only intended to illustrate this disclosure.

As illustrated by FIG. 1, an array substrate according to an embodiment of this disclosure includes: a base substrate (not illustrated by FIG. 1), a plurality of first gate lines 111 located on the base substrate, and a plurality of first common electrode lines 112, a plurality of second common electrode lines 114, and a plurality of third common electrode lines 115, each located on the base substrate.

The plurality of first common electrode lines 112 are arranged parallel to the plurality of first gate lines 111, and each of the plurality of first common electrode line 112 is located between adjacent two of the plurality of first gate lines 111.

The plurality of second common electrode lines 114 intersect with and are insulated from the plurality of first common electrode lines 112, and are electrically connected with a part of the plurality of first common electrode lines 112.

The plurality of third common electrode lines 115 intersect with and are insulated from the plurality of first common electrode lines 112, and are electrically connected with another part of the plurality of first common electrode lines 112.

Voltage values of voltage signals received by the plurality of second common electrode lines 114 and by the plurality of third common electrode lines 115 are different.

In FIG. 1, 113 represents a plurality of data lines arranged on the base substrate, and each circle represents a position where one of the plurality of second common electrode lines 114 is electrically connected with one of the plurality of first common electrode lines 112, or a position where one of the plurality of third common electrode lines 115 is electrically connected with one of the plurality of first common electrode lines 112. The ways how the plurality of second common electrode lines 114 are electrically connected with the plurality of first common electrode lines 112, and how the plurality of third common electrode lines 115 are electrically connected with the plurality of first common electrode lines 112, are described in detail in the following implementation modes of the embodiment.

According to the embodiment of this disclosure, the array substrate includes the plurality of first common electrode lines, the plurality of second common electrode lines, and the plurality of third common electrode lines. The plurality of first common electrode lines are arranged parallel to the plurality of first gate lines, and each of the plurality of first common electrode line is located between adjacent two of the plurality of first gate lines. The plurality of second common electrode lines are electrically connected with the plurality of first common electrode lines, and the plurality of third common electrode lines are electrically connected with the plurality of first common electrode lines. The voltage values of the voltage signals received by the plurality of second common electrode lines and by the plurality of third common electrode lines are different. As such, due to the arrangement of the plurality of second common electrode lines and the plurality of third common electrode lines according to the embodiment of this disclosure, different areas of the array substrate can have different common voltages, thus alleviating the problem of crosstalk and afterimage, and improving the display quality.

Furthermore, since the plurality of second common electrode lines and the plurality of third common electrode lines intersect with the plurality of first common electrode lines, the plurality of second common electrode lines are electrically connected with a part of the plurality of first common electrode lines, and the plurality of third common electrode lines electrically connected with the other part of the plurality of first common electrode lines, the plurality of first common electrode lines are connected in parallel via the plurality of second common electrode lines and the plurality of third common electrode lines, respectively, thereby lowering resistance of the common electrode lines as a whole to lower a voltage across the common electrode lines and to improve uniformity of a displayed image.

Arrangement of the plurality of first common electrode lines, the plurality of second common electrode lines, and the plurality of third common electrode lines in the array substrate according to the embodiment of this disclosure will be described below in details in connection with particular implementation modes thereof.

First implementation mode of the embodiment is as follows.

Figure 2:
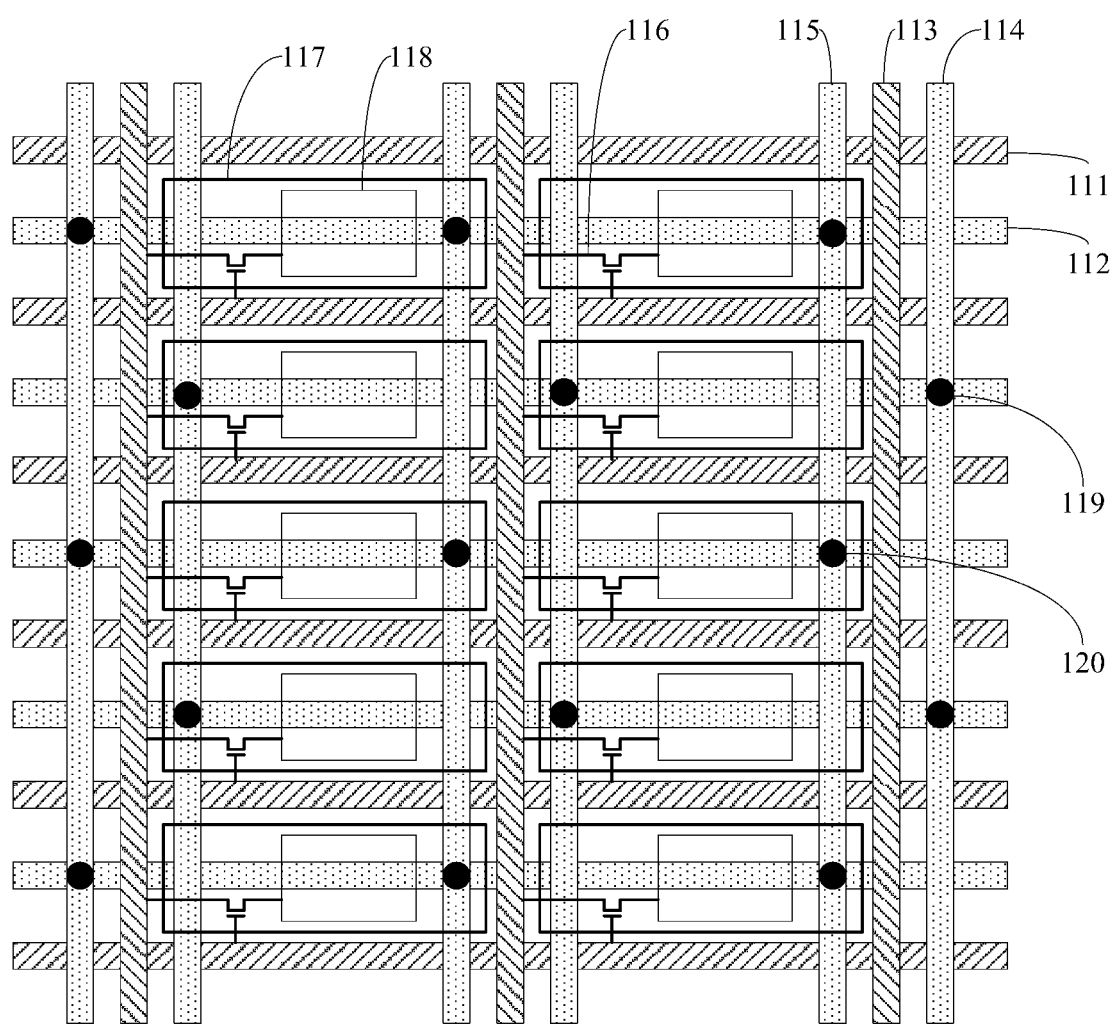
FIG. 2 is a schematic diagram of a structure of an array substrate according to a first implementation mode of the embodiment of this disclosure.

As illustrated by FIG. 2, the plurality of second common electrode lines 114 and the plurality of third common electrode lines 115 according to the first implementation mode are parallel to the plurality of data lines 113.

As illustrated by FIG. 2, for each of a plurality of sub-pixel elements 117 arranged on the base substrate, one of the plurality of second common electrode lines 14 and one of the plurality of third common electrode lines 115 can be arranged in edge areas of the sub-pixel element 117 arranged on the base substrate. According to the first implementation mode, a common electrode line located on the right of one of the plurality of data lines 113 is referred to as one of the plurality of second common electrode lines 114, and a common electrode line located on the left of the data line 113 is referred to as one of the plurality of third common electrode lines 115. One of the plurality of sub-pixel elements 117 can be a red (R) sub-pixel element, a green (G) sub-pixel element, or a blue (B) sub-pixel element. Of course, it can alternatively be a white (W) sub-pixel element, or a sub-pixel element in another color.

As illustrated by FIG. 2, the plurality of first gate lines 111 are arranged in parallel in a row direction. Width of each of the plurality of first gate line 111 ranges between 1 micrometer (μm) and 50 μm, width of each of the plurality of first common electrode line 112 ranges between 1 μm and 50 μm, and smallest spacing between one of the plurality of first gate lines 111 and one of the plurality of first common electrode lines 112 ranges between 1 μm and 50 μm. In a real production process, the plurality of first common electrode lines 112 and the plurality of first gate lines 111 are formed in a same patterning process, and the plurality of first common electrode lines 112 and the plurality of first gate lines 111 are made of same metallic material having same thickness. The patterning process in the first implementation mode includes a part or all of coating, exposing, developing, etching, and removing photo-resist.

As illustrated by FIG. 2, the plurality of first common electrode lines 112 and the plurality of first gate lines 111 can be made of metal, such as copper (Cu), aluminum (Al), molybdenum (Mo), titanium (Ti), chrome (Cr), tungsten (W), or an alloy of these metals. Thickness of each of the plurality of first common electrode lines 112 and each of the plurality of first gate lines 111 ranges from 100 nanometers (nm) to 1000 nm.

As illustrated by FIG. 2, according to the first implementation mode, the plurality of data lines 113 are arranged in parallel in a column direction. Width of each of the plurality of data lines 113 ranges from 1 μm to 50 μm, Width of each of the plurality of second common electrode lines 114 ranges from 1 μm to 50 μm, and width of each of the plurality of third common electrode lines 115 ranges from 1 μm to 50 μm. The plurality of data lines 113, the plurality of second common electrode lines 114, and the plurality of third common electrode lines 115 can be formed in a same patterning process, and are made of same metallic material having same thickness.

As illustrated by FIG. 2, the plurality of data lines 113, the plurality of second common electrode lines 114, and the plurality of third common electrode lines 115 can be made of metal including any one or a combination of Cu, Al, Mo, Ti, Cr, and W. Thickness of each of the plurality of data lines 113, each of the plurality of second common electrode lines 114, and each of the plurality of third common electrode lines 115 ranges from 100 nm to 1000 nm. Smallest spacing between any one of the plurality of second common electrode lines 114 and any one of the plurality of data lines ranges from 1 μm to 50 μm, and smallest spacing between any one of the plurality of third common electrode lines 115 and any one of the plurality of data lines ranges from 1 μm to 50 μm.

As illustrated by FIG. 2, thin film transistors 116 for controlling the plurality of sub-pixel elements 117 are formed at intersections of the plurality of first gate lines 111 and the plurality of data lines 113. Each thin film transistor 116 includes a gate, a semiconductor active layer, a source, and a drain, where the source and the drain can come into direct contact with the semiconductor active layer, or a doped semiconductor thin film on a surface of the semiconductor active layer, or can come into contact with the semiconductor active layer, or a doped semiconductor thin film on the surface of the semiconductor active layer through through-holes. The thin film transistors 116 can be formed as in the related art, so a repeated description thereof is omitted here. The sources and the drains are formed in the same patterning process as the plurality of data lines 113. The sources of the thin film transistors 116 are not connected with the plurality of second common electrode lines 114, the sources of the thin film transistors 116 are electrically connected with the plurality of data lines 113 through through-holes at passivation layers overlying the thin film transistors 116, and the drains of the thin film transistors 116 are electrically connected with pixel electrodes 118 in the plurality of sub-pixel elements 117 through through-holes at the overlying passivation layers. Material of the pixel electrodes 118 can be indium tin oxide (ITO), indium zinc oxide (IZO), or another type of transparent metal oxide, and thickness of each pixel electrode 118 ranges from 10 nm to 1000 nm.

As illustrated by FIG. 2, since the sources of the thin film transistors 116 are located at the same layer as the plurality of second common electrode lines 114, the sources of the thin film transistors 116, when connected with the plurality of data lines 113, shall be disconnected from the plurality of second common electrode lines 114 at intersections of the sources and the plurality of second common electrode lines 114, and are connected with the plurality of data lines 113 through bridge lines at the disconnected positions. The bridge lines can be formed in the same patterning process as the pixel electrodes 118. The pixel electrodes 118 can be formed and connected with the drains of the thin film transistors 116 as in the related art, so a repeated description thereof is omitted herein.

As illustrated by FIG. 2, according to the first implementation mode, the array substrate includes a first insulation layer (not illustrated by FIG. 2) located between the plurality of second common electrode lines 114 and the plurality of first common electrode lines 112, and a second insulation layer (not illustrated by FIG. 2) located between the plurality of third common electrode lines 115 and the plurality of first common electrode lines 112. The first insulation layer and the second insulation layer can be made of silicon dioxide ($SiO_2$), silicon nitride (SiN), organic material, or any combination thereof. Thickness of the first insulation layer and of the second insulation layer ranges from 100 nm to 1000 nm.

As illustrated by FIG. 2, the plurality of second common electrode lines 114 are electrically connected with the plurality of first common electrode lines 112 through first through-holes 119 running through the first insulation layer, and the plurality of third common electrode lines 115 are electrically connected with the plurality of first common electrode lines 112 through second through-holes 120 running through the second insulation layer. A diameter of each first through-hole 119 and of each second through-hole 120 ranges from 1 μm to 50 μm.

As illustrated by FIG. 2, according to the first implementation mode, the first through-holes 119 and the second through-holes 120 are located in different rows, respectively. Contact areas of the plurality of second common electrode lines 114 and the plurality of first common electrode lines 112 (i.e., where they are connected through the first through-holes 119) are located on the $(2i+1)$-th rows of the plurality of first common electrode lines 112, and contact areas of the plurality of third common electrode lines 115 and the plurality of first common electrode lines 112 (i.e., where they are connected through the second through-holes 120) are located on the $(2i+2)$-th rows of the plurality of first common electrode lines 112, where i is an integer no less than 0. Stated otherwise, in the first implementation mode, each first through-hole 119 is located on one of the plurality of first common electrode lines 112 which is on a same row as the first through-hole 119, and each second through-hole 120 is located on one of the plurality of first common electrode lines 112 which is on a same row as the second through-hole 120, where the first through-holes 119 and the second through-holes 120 are not positioned on same rows of the plurality of first common electrode lines 112, so that the first through-holes 119 and the second through-holes 120 are arranged in alternate rows of the plurality of first common electrode lines 112, respectively.

According to the first implementation mode, for each of the plurality of second common electrode lines 114 arranged in one of the plurality of sub-pixel elements 117, an orthographic projection on the base substrate of the second common electrode line 114 overlaps an orthographic projection on the base substrate of a pixel electrode 118 in the sub-pixel element 117. And/or, for each of the plurality of third common electrode lines 115 arranged in one of the plurality of sub-pixel elements 117, an orthographic projection on the base substrate of the third common electrode line 115 overlaps an orthographic projection on the base substrate of a pixel electrode 118 in the sub-pixel element 117. As such, parasitic capacitances between the pixel electrodes and the plurality of data lines can be lowered and light can be prevented from being leaked at edges, because the majority of power lines originating from the pixel electrodes are terminated on the common electrode lines on two sides of the plurality of data lines, thus alleviating the problem of crosstalk in effect.

As illustrated by FIG. 2, according to the first implementation mode, the first through-holes 119 and the second through-holes 120 are arranged densely to prevent the plurality of second common electrode lines 114 from coming into poor contact with the plurality of first common electrode lines 112, and to prevent the plurality of third common electrode lines 115 from coming into poor contact with the plurality of first common electrode lines 112. Of course, the first through-holes 119 and the second through-holes 120 can alternatively be arranged sparsely instead of being arranged as illustrated by FIG. 2. Since human eyes are insensitive to blue sub-pixels, in order to alleviate the impact of the common electrode lines have on pixel aperture ratio, in the first implementation mode, the through-holes through which the plurality of second common electrode lines are connected with the plurality of first common electrode lines, and the through-holes through which the plurality of third common electrode lines are connected with the plurality of first common electrode lines can be arranged only at positions corresponding to blue color resists on a color filter substrate.

According to the first implementation mode, voltage values of the voltage signals received by the plurality of second common electrode lines 114 and by the plurality of third common electrode lines 115 are different. Since the plurality of second common electrode lines 114 and the plurality of third common electrode lines 115 are connected with the plurality of first common electrode lines 112 in different areas, respectively, sub-pixel elements in different areas or adjacent rows have different common voltages, thus alleviating the problem of crosstalk and afterimage, and improving the display quality. In the first implementation mode, the plurality of second common electrode lines 114 and the plurality of third common electrode lines 115 are arranged relative to the plurality of first common electrode lines 112 in such a way that a plurality of first common electrode lines 112 can be connected in parallel to lower resistance of the common electrode lines so as to lower the voltage on the common electrode lines, thus improving the uniformity of the displayed image.

Second implementation mode of the embodiment is as follows.

Figure 3:
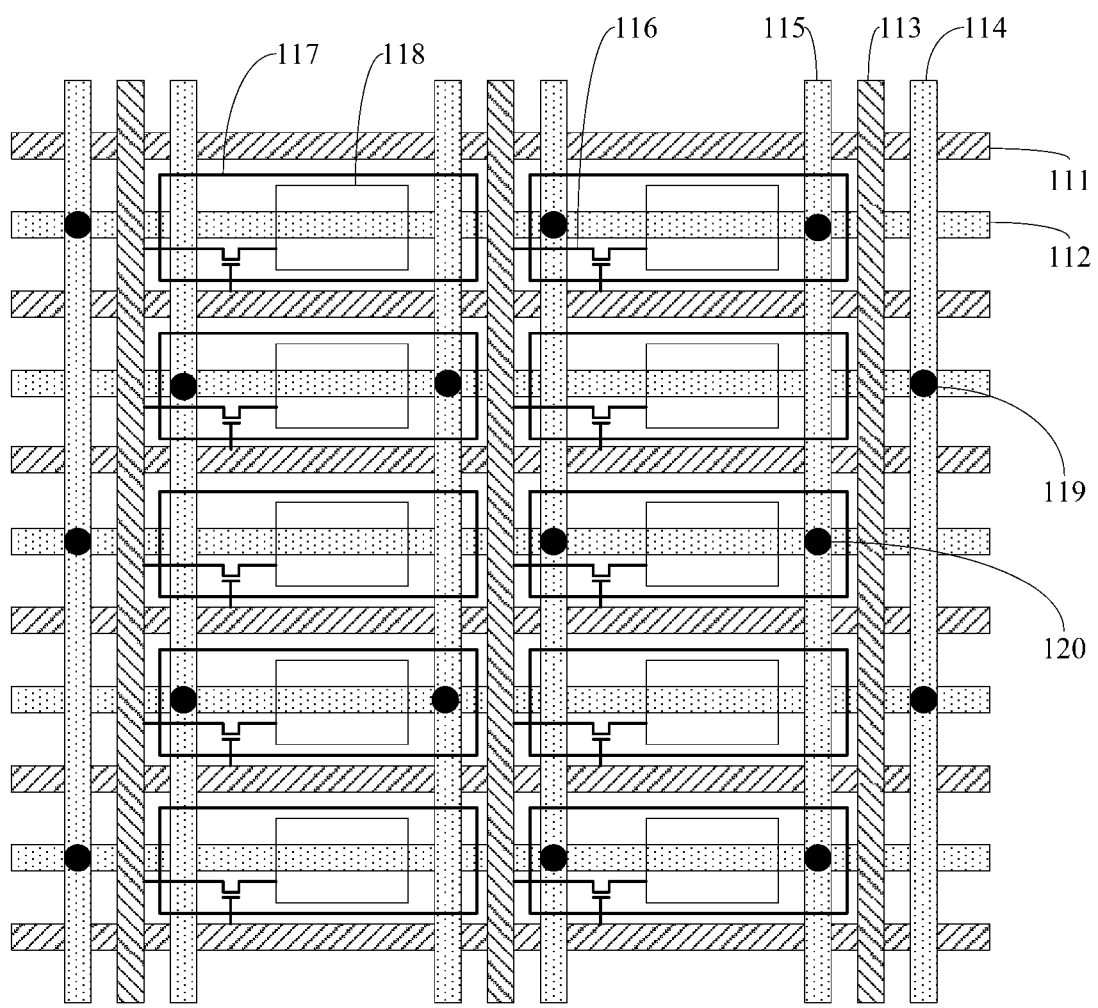
FIG. 3 is a schematic diagram of a structure of an array substrate according to a second implementation mode of the embodiment of this disclosure.

As illustrated by FIG. 3, the second implementation mode of the embodiment is different from the first implementation mode in that the plurality of second common electrode lines 114 and the plurality of third common electrode lines 115 are connected with the plurality of first common electrode lines 112 in ways which are different from those according to the first implementation mode.

As illustrated by FIG. 3, the array substrate according to the second implementation includes a first insulation layer (not illustrated by FIG. 3) located between the plurality of second common electrode lines 114 and the plurality of first common electrode lines 112, and a second insulation layer (not illustrated by FIG. 3) located between the plurality of third common electrode lines 115 and the plurality of first common electrode lines 112. The plurality of second common electrode lines 114 are electrically connected with the plurality of first common electrode lines 112 through first through-holes 119 running through the first insulation layer, and the plurality of third common electrode lines 115 are electrically connected with the plurality of first common electrode lines 112 through second through-holes 120 running through the second insulation layer.

As illustrated by FIG. 3, the first through-holes 119 and the second through-holes 120 are arranged alternately in the row direction. In the column direction, two second through-holes 120 are arranged in different adjacent columns of two adjacent first through-holes 119, and two first through-holes are arranged in different adjacent columns of two adjacent second through-holes, respectively. An area where one of the plurality of sub-pixel elements 117 is located corresponds to first through-holes 119 or second through-holes 120, and another area where another one of the plurality of sub-pixel elements 117 adjacent to the sub-pixel element 117 above is located does not corresponds to any first through-hole 119 or second through-hole 120. Adjacent two of the plurality of second common electrode lines 114 and adjacent two of the plurality of first common electrode lines 112 have two contact areas, where the two contact areas correspond to different areas where two of the plurality of sub-pixel elements 117 at adjacent rows and at adjacent columns are located, respectively. Adjacent two of the plurality of third common electrode lines 115 and adjacent two of the plurality of first common electrode lines 112 have two contact areas, where the two contact areas correspond to different areas where two of the plurality of sub-pixel elements 117 at adjacent rows and at adjacent columns are located, respectively.

As illustrated by FIG. 3, one of the plurality of second common electrode lines 114 on the right of an i-th data line 113 of the plurality of data lines 113 is electrically connected with a j-th first common electrode line 112 of the plurality of first common electrode lines 112. One of the plurality of third common electrode lines 115 on the left of an (i+1)-th data line 113 of the plurality of data lines 113 is electrically connected with the j-th first common electrode line 112. One of the plurality of second common electrode lines 114 on the right of the (i+1)-th data line 113 is electrically connected with a (j+1)-th first common electrode line 112 of the plurality of first common electrode lines 112, and one of the plurality of third common electrode lines 115 on the left of an (i+2)-th data line 113 of the plurality of data lines 113 is electrically connected with the (j+1)-th first common electrode line 112, where i and j are positive integers more than or equal to 1.

Third implementation mode of the embodiment is as follows.

Figure 4:
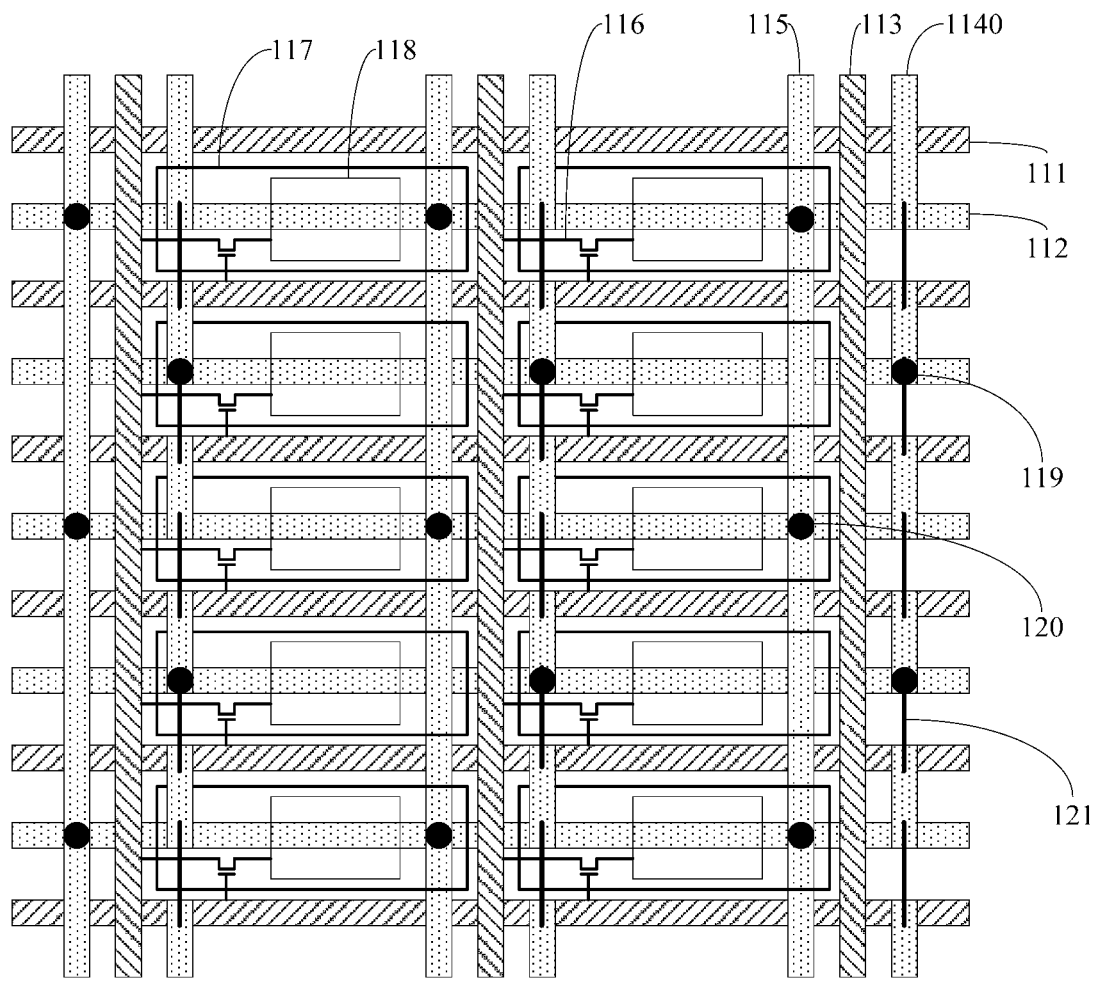
FIG. 4 is a schematic diagram of a structure of an array substrate according to a third implementation mode of the embodiment of this disclosure.

As illustrated by FIG. 4, the third implementation mode is different from the first implementation mode in that the plurality of second common electrode lines 114 or the plurality of third common electrode lines 115 are arranged in pattern different from that in the first implementation mode.

As illustrated by FIG. 4, the array substrate according to the implementation mode further includes a plurality of common electrode connection lines 121. The plurality of second common electrode lines 114 and the plurality of third common electrode lines 115 are parallel to the plurality of data lines 113. One of the plurality of second common electrode lines 114 and one of the plurality of third common electrode lines 115 are arranged at edge areas of each of the plurality of sub-pixel elements 117.

As illustrated by FIG. 4, each of the plurality of second common electrode lines 114 includes a plurality of second sub-common electrode lines 1140, an area between adjacent two of the plurality of second sub-common electrode lines 1140 corresponds to an area of a thin film transistor 116, and the two adjacent second sub-common electrode lines 1140 are bridged through one of the plurality of common electrode connection lines 121. Or each of the plurality of third common electrode lines 115 includes a plurality of third sub-common electrode lines, an area between adjacent two of the plurality of third sub-common electrode lines corresponds to an area of a thin film transistor 116, and the two adjacent third sub-common electrode lines are bridged through one of the plurality of common electrode connection lines 121. FIG. 4 only illustrates the situation where each of the plurality of second common electrode lines 114 includes the plurality of second sub-common electrode lines 1140.

An insulation layer is arranged between the plurality of second sub-common electrode lines 1140 and the plurality of common electrode connection lines 121, and the plurality of common electrode connection lines 121 connect the plurality of discrete second sub-common electrode lines 1140 through through-holes running through the insulation layer so that the plurality of second sub-common electrode lines 1140 are connected into continuous wires. According to the third implementation mode, the plurality of common electrode connection lines 121 are made of the same electrically-conductive thin film material having the same thickness as the pixel electrodes 118, and are formed in the same photolithograph process as the pixel electrodes 118.

According to the third implementation mode, an area between two adjacent second sub-common electrode lines 1140 or an area between two adjacent third sub-common electrode lines 1150 corresponds to a position of a thin film transistor 116 in one of the plurality of sub-pixel elements 117, so that the second common electrode line 114 or the third common electrode line 115 can bypass the thin film transistor 116, and the source of the thin film transistor 116 can be electrically connected with one of the plurality of data lines 113 directly.

As illustrated by FIG. 4, in the third implementation mode, the plurality of second common electrode lines 114 and the plurality of third common electrode lines 115 are connected with the plurality of first common electrode lines 112, in the same ways as in the first implementation mode of the embodiment, and the first through-holes 119 and the second through-holes 120 are arranged in alternate rows.

Fourth implementation mode of the embodiment is as follows.

Figure 5:
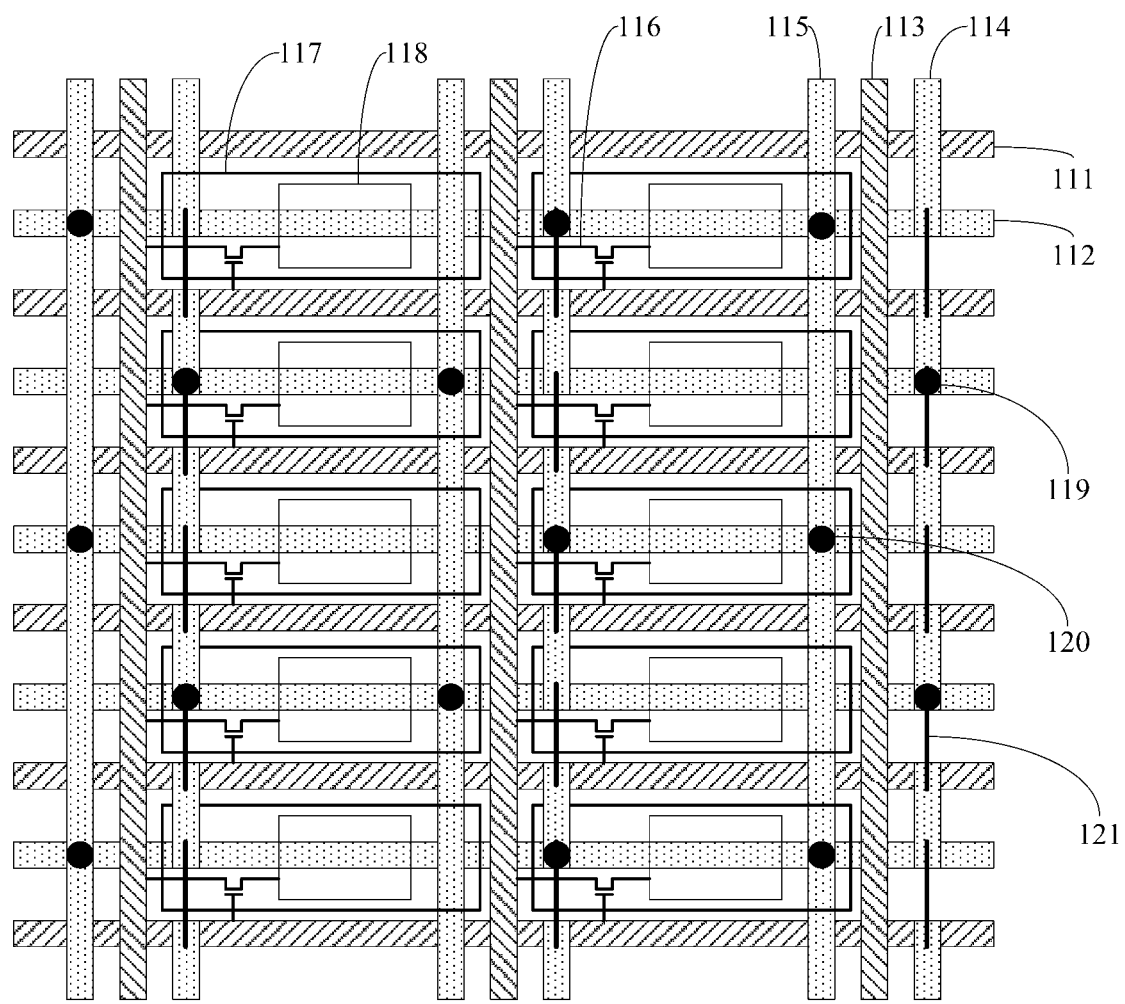
FIG. 5 is a schematic diagram of a structure of an array substrate according to a fourth implementation mode of the embodiment of this disclosure.

As illustrated by FIG. 5, the fourth implementation mode of the embodiment is different from the third implementation mode of the embodiment in that the plurality of second common electrode lines 114 and the plurality of third common electrode lines 115 are connected with the plurality of first common electrode lines 112 in ways different from those according to the third implementation mode of the embodiment.

As illustrated by FIG. 5, according to the fourth implementation mode, the way how the plurality of second common electrode lines 114 and the plurality of third common electrode lines 115 are connected with the plurality of first common electrode lines 112 is the same as the way how the plurality of second common electrode lines 114 and the third common electrode lines 115 are connected with the plurality of first common electrode lines 112 according to the second implementation mode. In particular, an area where one of the plurality of sub-pixel elements 117 is located corresponds to first through-holes 119 or second through-holes 120, and an area where another one of the plurality of sub-pixel elements 117 adjacent to the above-mentioned sub-pixel element 117 is located does not correspond to any first through-hole 119 or second through-hole 120.

Fifth implementation mode of the embodiment is as follows.

Figure 6:
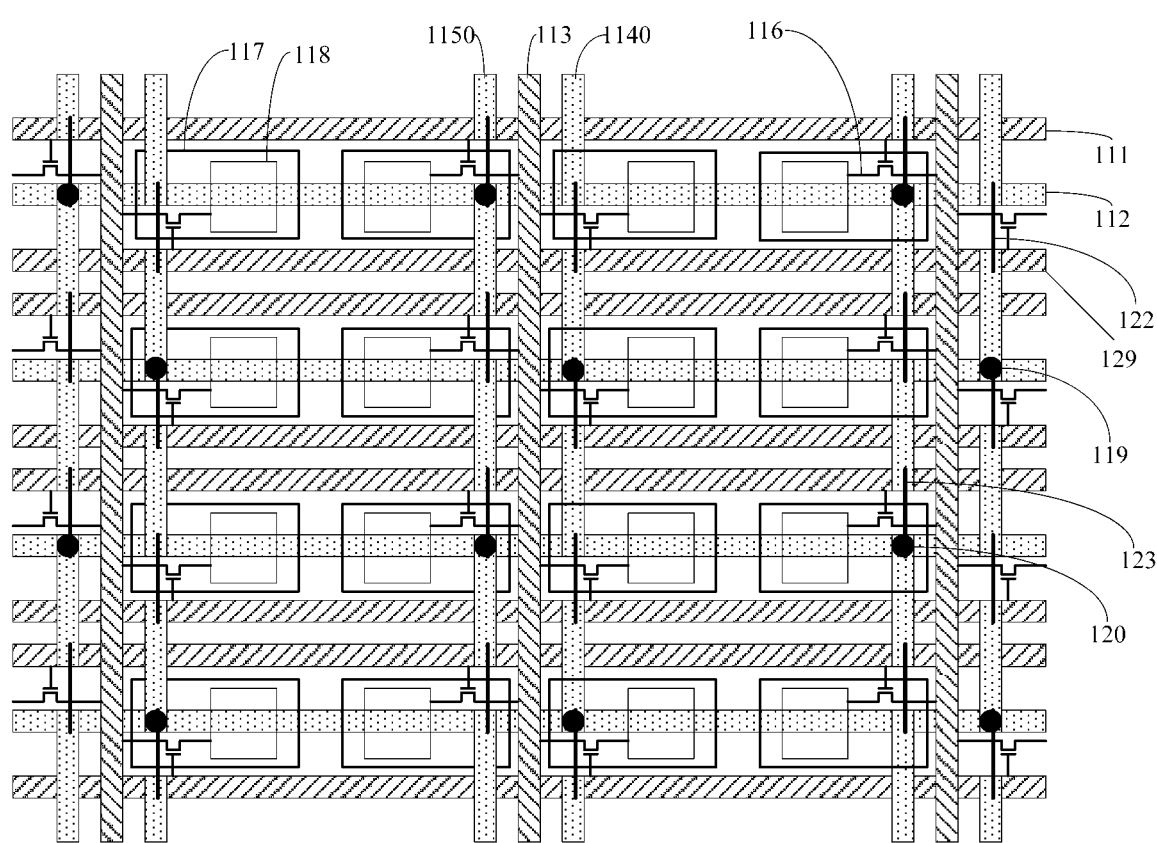
FIG. 6 is a schematic diagram of a structure of an array substrate according to a fifth implementation mode of the embodiment of this disclosure.

As illustrated by FIG. 6, the fifth implementation mode of this disclosure is different from the first implementation mode of the embodiment in a different arrangement pattern of the plurality of second common electrode lines 114 or the plurality of third common electrode lines 115, different positions of the thin film transistors 116, and a different arrangement pattern of the plurality of first gate lines 111.

As illustrated by FIG. 6, the array substrate according to the fifth implementation mode further includes first common electrode connection lines 122 and second common electrode connection lines 123. The plurality of second common electrode lines 114 and the plurality of third common electrode lines 115 are parallel to the plurality of data lines 113, and one of the plurality of second common electrode lines 114 or one of the plurality of third common electrode lines 115 is arranged at an edge area of each of the plurality of sub-pixel elements 117.

As illustrated by FIG. 6, each of the plurality of second common electrode lines 114 includes a plurality of second sub-common electrode lines 1140, an area between two adjacent second sub-common electrode lines 1140 corresponds to an area of a thin film transistor 116, and the adjacent second sub-common electrode lines 1140 are bridged through one of the first common electrode connection lines 122. Each of the plurality of third common electrode lines 115 includes a plurality of third sub-common electrode lines 1150, an area between two adjacent third sub-common electrode lines 1150 corresponds to an area of a thin film transistor 116, and the adjacent third sub-common electrode lines 1150 are bridged through one of the second common electrode connection lines 123.

An insulation layer is arranged between the plurality of second sub-common electrode lines 1140 and the first common electrode connection lines 122, and the first common electrode connection lines 122 connect the plurality of second sub-common electrode lines 1140 through through-holes running through the insulation layer so that the plurality of second sub-common electrode lines 1140 are connected into continuous wires. An insulation layer is arranged between the plurality of third sub-common electrode lines 1150 and the second common electrode connection lines 123, and the second common electrode connection lines 123 connect the plurality of third sub-common electrode lines 1150 through through-holes running through the insulation layer so that the plurality of third sub-common electrode lines 1150 are connected into continuous wires. In the fifth implementation mode, the first common electrode connection lines 122 and the second common electrode connection lines 123 are made of the same electrically-conductive thin film material having the same thickness as the pixel electrodes 118, and are formed in the same photolithograph process as the pixel electrodes 118.

As illustrated by FIG. 6, the fifth implementation mode is also different from the first implementation mode in that the thin film transistors are arranged at different positions and the plurality of first gate lines 111 are arranged differently. According to the fifth implementation mode, the sources of the thin film transistors can be connected with the plurality of data lines 113 directly. The array substrate according to the fifth implementation mode further includes second gate lines 129, a second gate line 129 and one of the plurality of first gate lines 111 are located on different sides of each row of sub-pixel elements 117, and two adjacent sub-pixel elements 117 in a same row and connected with a same data line 113 are connected with the second gate line 129 and the first gate line 111 arranged on two sides of the plurality of sub-pixel elements 117, respectively. With this design, the number of data lines 113 can be reduced, the cost of driver chip can be lowered, manufacturing of high-resolution display panel and dot inversion are facilitated, and power consumption can be lowered.

As illustrated by FIG. 6, according to the fifth implementation mode, the ways how the plurality of second common electrode lines 114 and the plurality of third common electrode lines 115 are connected with the plurality of first common electrode lines 112 are the same as those in the first implementation mode of the embodiment, and the first through-holes 119 and the second through-holes 120 are arranged in alternate rows.

Sixth implementation mode of the embodiment is as follows.

Figure 7:
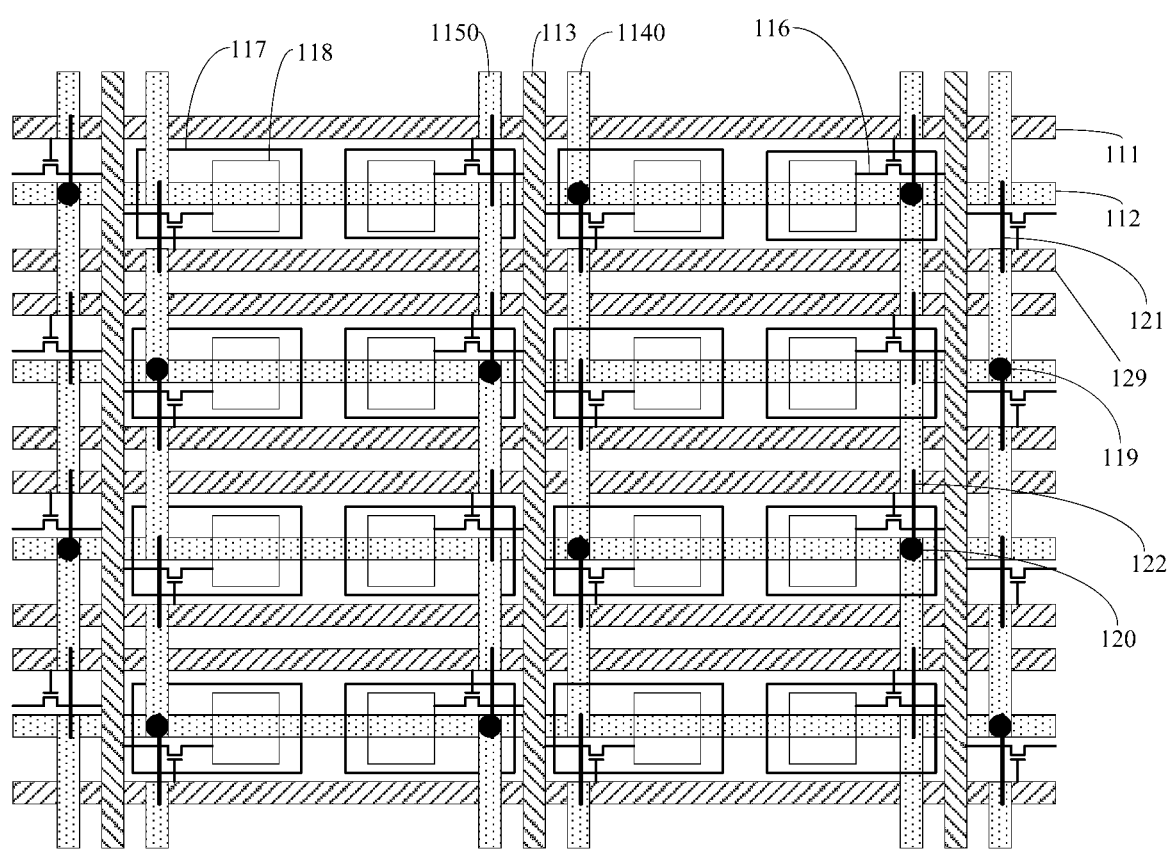
FIG. 7 is a schematic diagram of a structure of an array substrate according to a sixth implementation mode of the embodiment of this disclosure.

As illustrated by FIG. 7, the sixth implementation mode of the embodiment is different from the fifth implementation mode of the embodiment in that the ways how the plurality of second common electrode lines 114 and the plurality of third common electrode lines 115 are connected with the plurality of first common electrode lines 112 are different.

As illustrated by FIG. 7, according to the sixth implementation mode of the embodiment, the plurality of second common electrode lines 114 and the plurality of third common electrode lines 115 are connected with the plurality of first common electrode lines 112 in the same way as those in the second implementation mode of the embodiment. That is, the first through-holes 119 and the second through-holes 120 are arranged alternately in the row direction; whereas in the column direction, two second through-holes 120 are arranged in different adjacent columns of two adjacent first through-holes 119, and two first through-holes are arranged in different adjacent columns of two adjacent second through-holes, respectively.

As illustrated by FIG. 7, adjacent two of the plurality of sub-pixel elements 117 in a same row between adjacent two of the plurality of data lines 113 constitute a sub-pixel element group 70. An area where a sub-pixel element group 70 is located corresponds to first through-holes 119 or second through-holes 120, and another area where another sub-pixel element group 170 adjacent to the sub-pixel element group 70 above is located does not correspond to any first through-hole 119 or second through-hole 120.

Seventh implementation mode of the embodiment is as follows.

Figure 8:
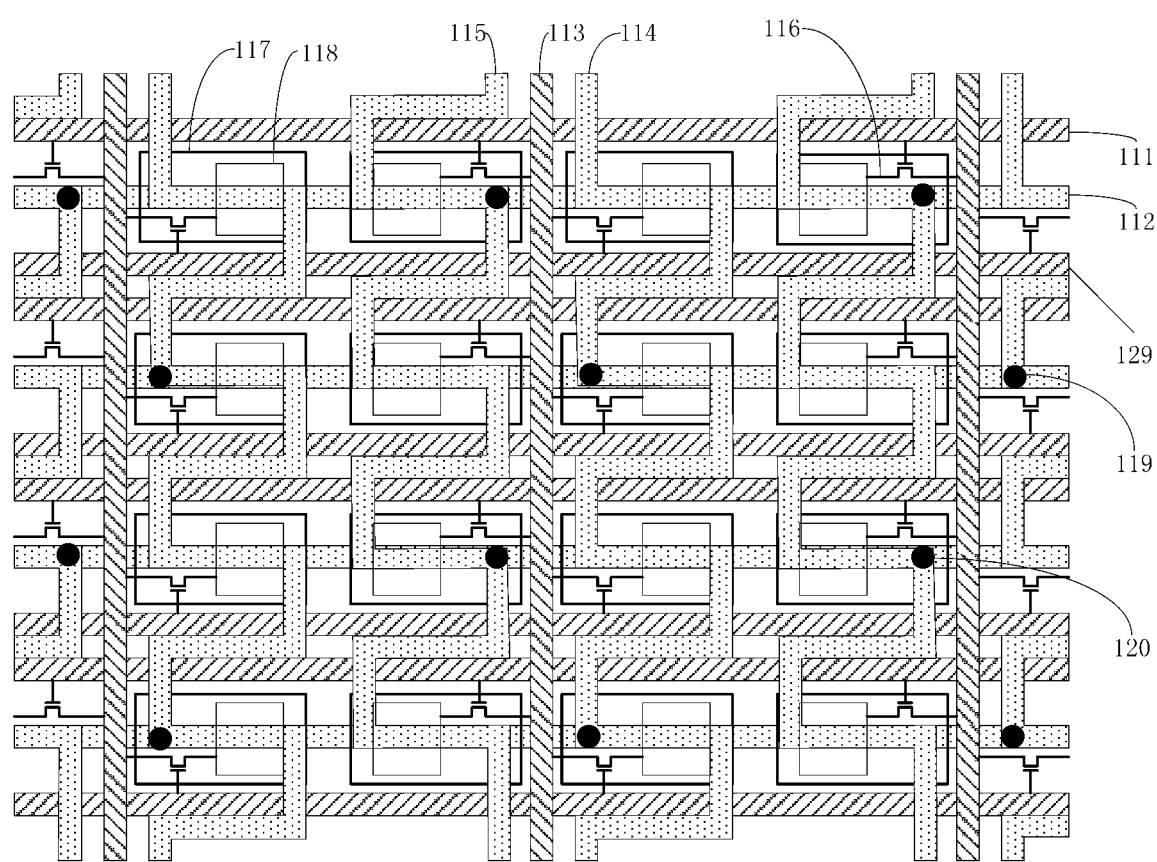
FIG. 8 is a schematic diagram of a structure of an array substrate according to a seventh implementation mode of the embodiment of this disclosure.

As illustrated by FIG. 8, the seventh implementation mode of the embodiment is different from the first implementation mode of the embodiment in a different arrangement pattern of the plurality of second common electrode lines 114 or the plurality of third common electrode lines 115, different positions of the thin film transistors 116, and a different arrangement pattern of the plurality of first gate lines 111.

As illustrated by FIG. 8, according to the seventh implementation mode of the embodiment, the thin film transistors 116 are arranged at the same positions and the plurality of first gate lines 111 are arranged in the same pattern as the thin film transistors 116 and the plurality of first gate lines 111 in the fifth implementation mode of the embodiment, so a repeated description thereof is omitted herein.

As illustrated by FIG. 8, according to the seventh implementation mode of the embodiment, each of the plurality of second common electrode lines 114 is arranged in a broken line, and each of the plurality of third common electrode lines 115 is arranged in a broken line. For each of the plurality of sub-pixel elements 117, one of the plurality of second common electrode lines 114 or one of the plurality of third common electrode lines 115 is arranged in an area corresponding to the sub-pixel element 117.

As illustrated by FIG. 8, for each of the plurality of second common electrode lines 114, a part of the second common electrode line 114 is arranged parallel to the plurality of data lines 113, and another part thereof is arranged parallel to the plurality of first gate lines 111, so that the second common electrode line 114 could bypass a thin film transistor 116 in one of the plurality of sub-pixel elements 117. For each of the plurality of third common electrode lines 115, a part of the third common electrode line 115 is arranged parallel to the plurality of data lines 113, and the another part thereof is arranged parallel to the plurality of first gate lines 111, so that the third common electrode line 115 could bypass a thin film transistors 116 in one of the plurality of sub-pixel elements 117. In this way, the sources of the thin film transistors can be electrically connected with the plurality of data lines directly.

As illustrated by FIG. 8, the parts of the plurality of second common electrode lines 114 arranged parallel to the plurality of first gate lines 111 can be arranged in areas where the plurality of second common electrode lines 114 and the plurality of first common electrode lines 112 overlap, or can be arranged between the plurality of first gate lines 111 and the second gate lines 129. The parts of the plurality of third common electrode lines 115 arranged parallel to the plurality of first gate lines 111 can be arranged in areas where the plurality of third common electrode lines 115 and the plurality of first common electrode lines 112 overlap, or can be arranged between the plurality of first gate lines 111 and the second gate lines 129.

As illustrated by FIG. 8, in the seventh implementation mode of the embodiment, the plurality of second common electrode lines 114 and the plurality of third common electrode lines 115 are connected with the plurality of first common electrode lines 112, in the same pattern as in the first implementation mode of the embodiment, and the first through-holes 119 and the second through-holes 120 are arranged in alternate rows.

Eighth implementation mode of the embodiment is as follows.

Figure 9:
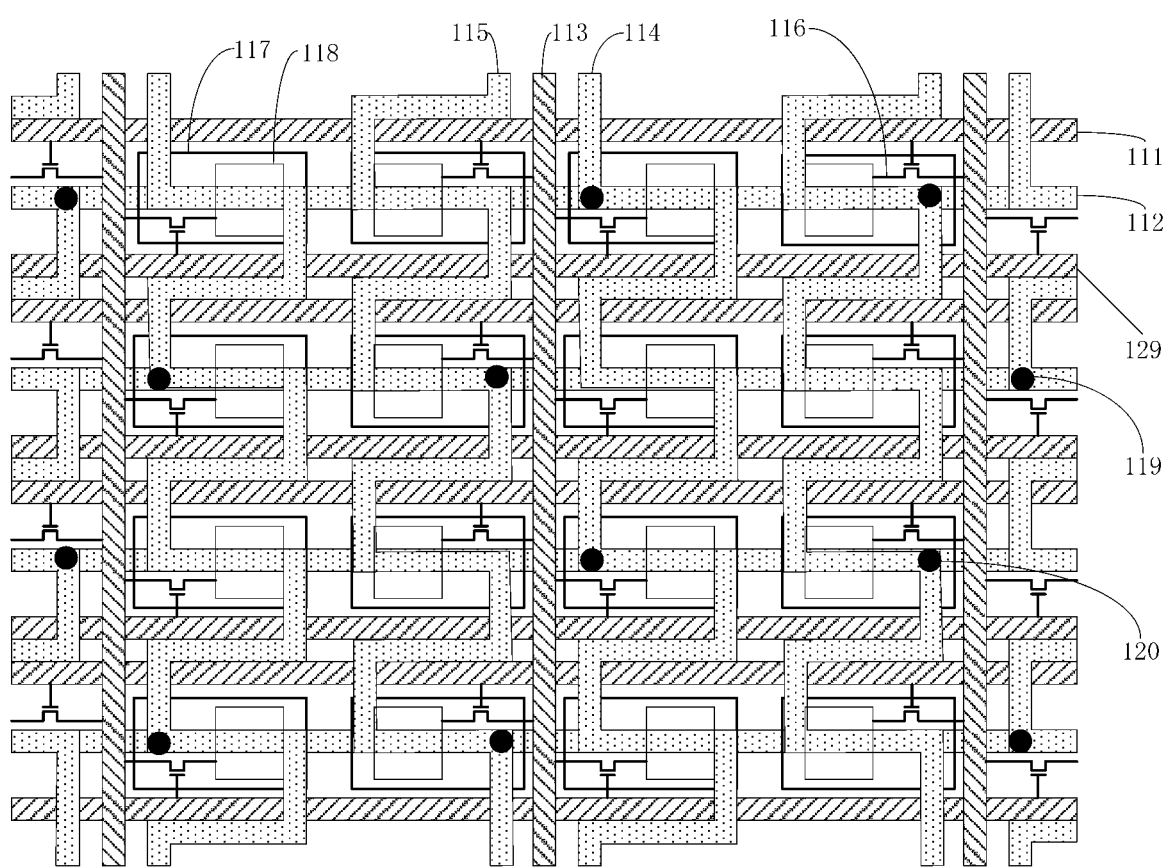
FIG. 9 is a schematic diagram of a structure of an array substrate according to an eighth implementation mode of the embodiment of this disclosure.

As illustrated by FIG. 9, the eighth implementation mode of the embodiment is different from the seventh implementation mode of the embodiment in that the ways how the plurality of second common electrode lines 114 and the plurality of third common electrode lines 115 are connected with the plurality of first common electrode lines 112 are different.

As illustrated by FIG. 9, in the eighth implementation mode of the embodiment, the plurality of second common electrode lines 114 and the plurality of third common electrode lines 115 are connected with the plurality of first common electrode lines 112 in the same way as 112 in the second implementation mode of the embodiment. That is, the first through-holes 119 and the second through-holes 120 are arranged alternately in the row direction. In the column direction, two second through-holes 120 are arranged in different adjacent columns of two adjacent first through-holes 119, and two first through-holes are arranged in different adjacent columns of two adjacent second through-holes, respectively.

As illustrated by FIG. 9, adjacent two of the plurality of sub-pixel elements 117 in a same row between adjacent two of the plurality of data lines 113 constitute a sub-pixel element group 70. An area where a sub-pixel element group 70 is located corresponds to first through-holes 119 or second through-holes 120, and another area where another sub-pixel element group 170 adjacent to the sub-pixel element group 70 above is located does not correspond to any first through-hole 119 or second through-hole 120.

Ninth implementation mode of the embodiment is as follows.

Figure 10:
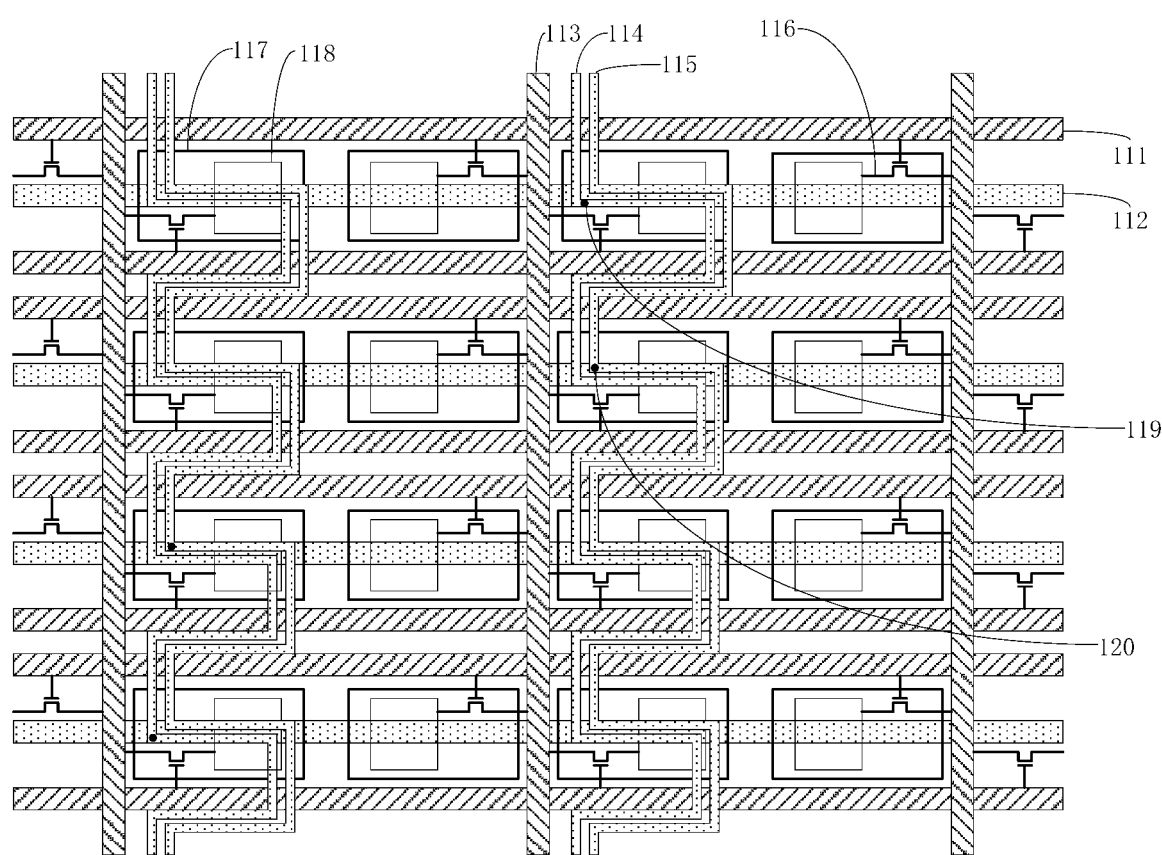
FIG. 10 is a schematic diagram of a structure of an array substrate according to a ninth implementation mode of the embodiment of this disclosure.

As illustrated by FIG. 10, the ninth implementation mode of the embodiment is different from the seventh implementation mode of the embodiment in a different arrangement pattern of the plurality of second common electrode lines 114 or the plurality of third common electrode lines 115, and different ways of connections of the plurality of second common electrode lines 114 with the plurality of first common electrode lines 112, and of the plurality of third common electrode lines 115 with the plurality of first common electrode lines 112.

As illustrated by FIG. 10, according to the ninth implementation mode of the embodiment, each of the plurality of second common electrode lines 114 is arranged in a broken line, and each of the plurality of third common electrode lines 115 is arranged in a broken line. The plurality of second common electrode lines 114 and the plurality of third common electrode lines 115 are arranged in areas corresponding to a part of the plurality of sub-pixel elements 117.

As illustrated by FIG. 10, the plurality of second common electrode lines 114 and the plurality of third common electrode lines 115 are arranged at corresponding positions of the part of the plurality of sub-pixel elements 117, where the part of the plurality of sub-pixel elements are arranged in odd (or even) columns. For each of the plurality of data lines 113, one of the plurality of second common electrode lines 114 and one of the plurality of third common electrode lines 115 are arranged on one side of the data line 113, and neither second common electrode line 114 nor third common electrode line 115 is arranged on the other side thereof. Of course, the plurality of second common electrode lines 114 and the plurality of third common electrode lines 115 can alternatively be arranged in another pattern. For example, for each of the plurality of data lines, one of the plurality of second common electrode lines and the plurality of third common electrode lines is arranged on one side of the data line, neither second common electrode line nor third common electrode line is arranged on the other side thereof, and the common electrode lines are not arranged on the same side of any adjacent two of the plurality of data lines, so that neither second common electrode line nor third common electrode line is arranged at pixel elements in odd (or even) columns. There can be other arrangement patterns, although they are not to be enumerated herein in details.

As illustrated by FIG. 10, according to the ninth implementation mode of the embodiment, the array substrate includes a first insulation layer (not illustrated by FIG. 10) located between the plurality of second common electrode lines 114 and the plurality of first common electrode lines 112, and a second insulation layer (not illustrated by FIG. 10) located between the plurality of third common electrode lines 115 and the plurality of first common electrode lines 112, where the plurality of second common electrode lines 114 are electrically connected with the plurality of first common electrode lines 112 through first through-holes 119 running through the first insulation layer, and the plurality of third common electrode lines 115 are electrically connected with the plurality of first common electrode lines 112 through second through-holes 120 running through the second insulation layer.

As illustrated by FIG. 10, contacts areas of the plurality of second common electrode lines 114 and the plurality of first common electrode lines 112 (i.e., where they are connected through the first through-holes 119) correspond to first sub-pixel elements, and contacts areas of the plurality of third common electrode lines 115 and the plurality of first common electrode lines 112 (i.e., where they are connected through the second through-holes 120) correspond to second sub-pixel elements, where the first sub-pixel elements and the second sub-pixel elements are parts of the plurality of sub-pixel elements at different positions.

As illustrated by FIG. 10, the first through-holes 119 and the second through-holes 120 are arranged in alternate rows. Each of through-hole pairs, which consists of a first through-hole 119 and a second through-hole 120, is located in an area corresponding to two of the plurality of sub-pixel elements 117 which are adjacent in the column direction. Through-holes are neither arranged at any intersections of parts of the plurality of second common electrode lines 114 adjacent to the first through-holes 119 and the plurality of first common electrode lines 112, nor arranged at any intersections of parts of the plurality of third common electrode lines 115 adjacent to the second through-holes 120 and the plurality of first common electrode lines 112. For each of the through-hole pairs, the through-hole pair is not arranged in any area corresponding to four sub-pixel elements 117 adjacent in the column direction or in the row direction. Such a design of sparsely distributed connection through-holes would help reduce the number of defects during manufacturing of the through-holes, thereby increasing the yield.

Of course, in each of the first to eighth implementation modes of this embodiment, sparsely distributed connection through-holes can also be arranged, and the sparsely distributed connection through-holes can be arranged in the same pattern as the through-holes in the ninth implementation mode of the embodiment. Or the sparsely distributed through-holes can also be arranged in another pattern. For example, through holes through which the plurality of second common electrode lines are connected with the plurality of first common electrode lines, and the plurality of third common electrode lines are connected with the plurality of first common electrode lines, are only arranged at positions corresponding to blue color resists on a corresponding color filter substrate.

Based upon the same inventive conception, an embodiment of the disclosure provides a display panel including the array substrate according to the implementation modes above. Since the common electrode lines are arranged at the layers where the plurality of first gate lines and the plurality of data lines are located, respectively, and the common electrode lines at the upper and lower layers are electrically connected through the through-holes, the common electrode lines are connected in parallel at a plurality of points, and the common electrode lines are structurally connected in a two-dimension planar grid, thereby greatly lowering the resistance of the common electrode lines so as to lower a voltage across the common electrode lines, and improving the uniformity of a displayed image. Since there are different voltage values of the voltage signals received by the plurality of second common electrode lines and by the plurality of third common electrode lines, according to the embodiment of the disclosure, the plurality of second common electrode lines and the plurality of third common electrode lines are arranged in such a way that there are different common voltages in different areas of the array substrate, thus alleviating the problem of crosstalk and afterimage, and improving the quality of a displayed image.

Based upon the same inventive conception, an embodiment of this disclosure further provides a display device including the display panel according to the embodiment of this disclosure above. The display device can be a mobile phone, a tablet computer, a liquid crystal TV set, a notebook computer, a digital photo frame, a navigator, or any other product or component having a display function. All other components indispensable to the display device shall readily occur to those ordinarily skilled in the art, so a repeated description thereof is omitted herein.

In summary, an embodiment of the disclosure provides an array substrate. The array substrate includes a base substrate, a plurality of first gate lines located on the base substrate, and a plurality of first, second and third common electrode lines located on the base substrate. The plurality of first common electrode lines are arranged parallel to the plurality of first gate lines, and each of the plurality of first common electrode lines is located between two adjacent first gate lines. The plurality of second common electrode lines intersect with and are insulated from the plurality of first common electrode lines, and are electrically connected with a part of the plurality of first common electrode lines. The plurality of third common electrode lines intersect with and are insulated from the plurality of first common electrode lines, and are electrically connected with another part of the common electrode lines. Voltage values of voltage signals received by the plurality of second common electrode lines and by the plurality of third common electrode lines are different. Since there are different voltage values of the voltage signals received by the plurality of second common electrode lines and by the plurality of third common electrode lines, the plurality of second common electrode lines and the plurality of third common electrode lines are arranged in such a way that there are different common voltages in different areas of the array substrate, thus alleviating the problem of crosstalk and afterimage, and improving the quality of a displayed image.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. An array substrate, comprising:
a base substrate;
a plurality of first gate lines located on the base substrate; and
a plurality of first common electrode lines, a plurality of second common electrode lines, and a plurality of third common electrode lines, each located on the base substrate, wherein:
the plurality of first common electrode lines are arranged parallel to the plurality of first gate lines, and each of the plurality of first common electrode lines is located between two adjacent first gate lines of the plurality of first gate lines;
the plurality of second common electrode lines intersect with and are insulated from the plurality of first common electrode lines, and are electrically connected with a part of the plurality of first common electrode lines;
the plurality of third common electrode lines intersect with and are insulated from the plurality of first common electrode lines, and are electrically connected with another part of the plurality of first common electrode lines; and
voltage values of voltage signals received by the plurality of second common electrode lines and by the plurality of third common electrode lines are different;
a plurality of sub-pixel elements arranged in an array, each comprising a thin film transistor; and
a plurality of common electrode connection lines; wherein
the plurality of second common electrode lines each comprise a plurality of second sub-common electrode lines, an area between adjacent two of the plurality of second sub-common electrode lines corresponds to an area of one of the thin film transistors, and the adjacent two second sub-common electrode lines are bridged through one of the plurality of common electrode connection lines; or
the plurality of third common electrode lines each comprise a plurality of third sub-common electrode lines, an area between adjacent two of the plurality of third sub-common electrode lines corresponds to an area of one of the thin film transistors, and the adjacent two third sub-common electrode lines are bridged through one of the plurality of common electrode connection lines; or
a plurality of sub-pixel elements arranged in an array, each comprising a thin film transistor; and
a plurality of first common electrode connection lines and second common electrode connection lines; wherein
the plurality of second common electrode lines each comprise a plurality of second sub-common electrode lines, an area between adjacent two of the plurality of second sub-common electrode lines corresponds to an area of one of the thin film transistors, and the adjacent two second sub-common electrode lines are bridged through one of the plurality of first common electrode connection lines; and
the plurality of third common electrode lines each comprise a plurality of third sub-common electrode lines, an area between adjacent two of the plurality of third sub-common electrode lines corresponds to an area of one of the thin film transistors, and the adjacent two third sub-common electrode lines are bridged through one of the plurality of second common electrode connection lines.

2. The array substrate according to claim 1, further comprising a plurality of data lines, wherein
the plurality of second common electrode lines are arranged parallel to the plurality of data lines, and the plurality of third common electrode lines are arranged parallel to the plurality of data lines.

3. The array substrate according to claim 2, further comprising a plurality of sub-pixel elements arranged in an array, wherein the plurality of second common electrode lines and/or the plurality of third common electrode lines are arranged in areas corresponding to at least a part of the plurality of sub-pixel elements.

4. The array substrate according to claim 3, further comprising a plurality of second gate lines, wherein:
the plurality of second gate lines and the plurality of first gate lines are located on different sides of rows of the plurality of sub-pixel elements; and
adjacent two of the plurality of sub-pixel elements in each row connected by a same data line are connected with one of the plurality of second gate lines and one of the plurality of first gate lines arranged on two sides of the adjacent two sub-pixel elements, respectively.

5. The array substrate according to claim 3, wherein each of the plurality of sub-pixel elements comprises a pixel electrode; and
orthographic projections on the base substrate of the plurality of second common electrode lines overlap orthographic projections on the base substrate of pixel electrodes comprised by at least a part of the plurality of sub-pixel elements, wherein the at least a part of the plurality of sub-pixel elements correspond to the areas where the plurality of second common electrode lines are arranged, and/or,
orthographic projections on the base substrate of the plurality of third common electrode lines overlap orthographic projections on the base substrate of pixel electrodes comprised by at least a part of the plurality of sub-pixel elements, wherein the at least a part of the plurality of sub-pixel elements correspond to the areas where the plurality of third common electrode lines are arranged.

6. The array substrate according to claim 2, further comprising:
a first insulation layer located between the plurality of second common electrode lines and the plurality of first common electrode lines; and
a second insulation layer located between the plurality of third common electrode lines and the plurality of first common electrode lines;
wherein:
the plurality of second common electrode lines are electrically connected with the plurality of first common electrode lines through first through-holes running through the first insulation layer, and the plurality of third common electrode lines are electrically connected with the plurality of first common electrode lines through second through-holes running through the second insulation layer;
the first through-holes and the second through-holes are arranged alternately in a row direction; and
in a column direction: two of the second through-holes are arranged in different adjacent columns of adjacent two of the first through-holes, respectively, and two of the first through-holes are arranged in different adjacent columns of adjacent two of the second through-holes, respectively.

7. The array substrate according to claim 2, further comprising:
a first insulation layer located between the plurality of second common electrode lines and the plurality of first common electrode lines; and
a second insulation layer located between the plurality of third common electrode lines and the plurality of first common electrode lines;
wherein:
the plurality of second common electrode lines are electrically connected with the plurality of first common electrode lines through first through-holes running through the first insulation layer, and the plurality of third common electrode lines are electrically connected with the plurality of first common electrode lines through second through-holes running through the second insulation layer; and
the first through-holes and the second through-holes are located in different rows.

8. The array substrate according to claim 1, wherein each of the plurality of second common electrode lines is arranged in a broken line, and each of the plurality of third common electrode lines is arranged in a broken line.

9. The array substrate according to claim 8, further comprising a plurality of data lines, and a plurality of sub-pixel elements arranged in an array, wherein:
each of the plurality of sub-pixel elements comprises a thin film transistor;
a part of each of the plurality of second common electrode lines is arranged parallel to the plurality of data lines, and another part thereof is arranged parallel to the plurality of first gate lines, so that the plurality of second common electrode lines bypass the thin film transistors; and
a part of each of the plurality of third common electrode lines is arranged parallel to the plurality of data lines, and another part thereof is arranged parallel to the plurality of first gate lines, so that the plurality of third common electrode lines bypass the thin film transistors.

10. The array substrate according to claim 9, wherein the plurality of second common electrode lines and/or the plurality of third common electrode lines are arranged in areas corresponding to at least a part of the plurality of sub-pixel elements.

11. The array substrate according to claim 8, further comprising a plurality of sub-pixel elements arranged in an array, wherein the plurality of second common electrode lines and/or the plurality of third common electrode lines are arranged in areas corresponding to at least a part of the plurality of sub-pixel elements.

12. The array substrate according to claim 1, further comprising:
a first insulation layer located between the plurality of second common electrode lines and the plurality of first common electrode lines; and
a second insulation layer located between the plurality of third common electrode lines and the plurality of first common electrode lines;
wherein:
the plurality of second common electrode lines are electrically connected with the plurality of first common electrode lines through first through-holes running through the first insulation layer, and the plurality of third common electrode lines are electrically connected with the plurality of first common electrode lines through second through-holes running through the second insulation layer;
areas comprising first sub-pixel elements correspond to the first through-holes, and areas comprising second sub-pixel elements correspond to the second through-holes; and
the first sub-pixel elements and the second sub-pixel elements are sub-pixel elements at different positions.

13. The array substrate according to claim 1, further comprising a plurality of data lines, wherein
the plurality of first common electrode lines and the plurality of first gate lines are arranged in a same layer;
the plurality of second common electrode lines and the plurality of third common electrode lines are arranged at a same layer and are insulated from each other; and the plurality of second common electrode lines and the plurality of third common electrode lines are arranged at the same layer as the plurality of data lines.

14. A display panel, comprising the array substrate according to claim 1.

15. A display device, comprising the display panel according to claim 14.

16. The array substrate according to claim 1, wherein the plurality of second common electrode lines and/or the plurality of third common electrode lines are arranged in areas corresponding to at least a part of the plurality of sub-pixel elements.

17. The array substrate according to claim 14, wherein the plurality of second common electrode lines and/or the plurality of third common electrode lines are arranged in areas corresponding to at least a part of the plurality of sub-pixel elements.

18. The array substrate according to claim 1, further comprising:
 a first insulation layer located between the plurality of second common electrode lines and the plurality of first common electrode lines; and
 a second insulation layer located between the plurality of third common electrode lines and the plurality of first common electrode lines;

wherein:

the plurality of second common electrode lines are electrically connected with the plurality of first common electrode lines through first through-holes running through the first insulation layer, and the plurality of third common electrode lines are electrically connected with the plurality of first common electrode lines through second through-holes running through the second insulation layer;

the first through-holes and the second through-holes are arranged alternately in a row direction; and in a column direction: two of the second through-holes are arranged in different adjacent columns of adjacent two of the first through-holes, respectively, and two of the first through-holes are arranged in different adjacent columns of adjacent two of the second through-holes, respectively.

\* \* \* \* \*